United States Patent [19]

Ho

[11] Patent Number: 5,232,871
[45] Date of Patent: Aug. 3, 1993

[54] METHOD FOR FORMING A TITANIUM NITRIDE BARRIER LAYER

[75] Inventor: Huei-Min Ho, Milpitas, Calif.

[73] Assignee: Intel Corporation, Santa Clara, Calif.

[21] Appl. No.: 869,227

[22] Filed: Jun. 3, 1992

Related U.S. Application Data

[62] Division of Ser. No. 635,868, Dec. 27, 1990, Pat. No. 5,175,126.

[51] Int. Cl.$^5$ .......................................... H01L 21/283
[52] U.S. Cl. ...................................... 437/190; 437/192
[58] Field of Search ................ 439/190, 192; 257/751, 257/764

[56] References Cited

U.S. PATENT DOCUMENTS

| | | | |
|---|---|---|---|
| 4,782,380 | 11/1988 | Shankar et al. | 357/71 |
| 4,897,709 | 1/1990 | Yokoyama et al. | 357/68 |
| 4,965,656 | 10/1990 | Koubuchi et al. | 357/71 |
| 4,976,839 | 12/1990 | Inoue | 204/192.17 |
| 5,070,036 | 12/1991 | Stevens | 437/190 |
| 5,094,981 | 3/1992 | Chung et al. | 437/190 |

OTHER PUBLICATIONS

Ting et al.; "The Use of Titanium-Based Contact Barrier Layers in Silicon Technology"; *Thin Solid Films;* pp. 327–345 (1982).
Kumar, et al.; "Growth and Properties of TiN and TiO$_x$N$_y$ Diffusion Barriers in Silicon on Sapphire Integrated Circuits"; *Thin Solid Films:* pp. 287–301 (1987).
Kumar, et al. "Failure Mechanisms of TiN Thin Film Diffusion Barriers"; *Thin Solid Films;* pp. 417–428 (1988).
Wittmer; "Barrier Layers: Principles and Applications in Microelectronics"; *J. Vac. Sci. Technol.;* pp. 273–279 (1984).
Sedgwick; "Rapid Thermal Processing: How Well is it Doing and Where is it Going?"; *Mat. Res. Soc. Symp. Proc.* vol. 92; pp. 3–12 (1987).
Sze; *VLSI Technology;* pp. 28–29 (1983).
Kamiura, et al.; "Generation of Several Kinds of Oxygen-Related Thermal Donors Around 520° C. in Czochralski Silicon"; *J. Appl. Phys;* pp. 3926–3929 (1989).
Kimerling; "Structure and Properties of the Oxygen Donor"; *Mat. Res. Soc. Symp. Proc.;* pp. 83–92 (1986).

*Primary Examiner*—T. N. Quach
*Attorney, Agent, or Firm*—Blakely, Sokoloff, Taylor & Zafman

[57] ABSTRACT

Two methods for substantially improving the integrity of a TiN barrier layer are disclosed. The first method allows an atmospheric anneal in a conventional semiconductor furnace. The atmospheric anneal substantially seals the exposed TiN surface preventing subsequent metal layers from migrating through the barrier layer. The second method involves a reaction within a plasma reactor using a plasma gas. The plasma gas reacts with titanium within the TiN film to form a desired titanium compound. The gas is adsorbed onto the TiN grains at the grain boundaries within the TiN film thus filling the grain boundaries and thus substantially preventing subsequent metal layers from migrating though the TiN barrier layer. The second method allows the deposition of TiN, the plasma reaction, and subsequent metal depositions to take place on the same equipment using the same evacuation cycle.

9 Claims, 1 Drawing Sheet

METHOD FOR FORMING A TITANIUM NITRIDE BARRIER LAYER

This is a divisional of application Ser. No. 07/635,868, filed Dec. 27, 1990, now U.S. Pat. No. 5,175,126.

FIELD OF THE INVENTION

The present invention relates to the field of processing semiconductor devices; particularly, to processes which employ barrier layers in forming electrical contacts to such devices.

BACKGROUND OF THE INVENTION

Semiconductor components are made by various process steps on a semiconductor substrate. Electrical circuits are defined during the earlier portion of the process sequence. Below are the key steps in a typical metal-oxide-semiconductor (MOS) process flow:
1. Form regions of field isolation;
2. Form a conductive gate over a dielectric;
3. Heavily dope the source and drain regions;
4. Deposit one or more dielectric layers to form an interlevel dielectric;
5. Form contact holes through the interlevel dielectric where metal is able to electrically contact the source, drain, or gate regions;
6. Deposit one or more metal layers and pattern the metal layers (metalization); and
7. Passivate the substrate using one or more dielectric layers.

Metalization of semiconductor components is not simply a matter of making contact openings and depositing metal. Traditionally, spike formation and metal diffusion into the substrate have complicated metalization. Spiking is a phenomenon that is related to solid solubilities. When two dissimilar materials come in contact with each other, there will be an equilibrium concentration of one of the materials into the other material. As an example, pure silicon and pure aluminum come in contact. Initially, there is a smooth interface between the two. During high temperature processing such as an alloy cycle, the aluminum can support larger amount of silicon. The silicon can go into the metal and leave a void. Conversely, the metal may diffuse through a heavily doped junction and cause a short circuit to the substrate. The result of both processes (silicon going to the aluminum and aluminum going into the silicon) is an aluminum-silicon interface that is not smooth. The process is referred to as spiking. Metal can diffuse into the substrate if the metal is capable of migrating through one or more barrier layers. Ideally, barrier layers keep the previously mentioned spiking and metal diffusion from occurring. In reality, barrier layers may not prevent spiking or metal diffusion.

Titanium nitride (TiN) is used as a barrier layer. However, TiN as sputtered suffers from two defects. First, TiN has a columnar structure. If a transmission electron micrograph were taken of the TiN, the TiN would appear as groups of columns or grains. The gaps between the columns are referred to as grain boundaries. Grain boundaries cause problems with barrier layers. The grain boundaries form a path through which the metal can migrate to reach the underlying substrate. If the metal migrates through the barrier layer, spike formation or metal diffusion into the substrate can occur.

Second, sputtering TiN itself causes a problem. A simple overview of sputtering techniques will indicate how the problem develops. A sputtering chamber is comprised of the following parts: a substrate, a target, the sputtering chamber itself, gases, and a power generator. The power generated can be direct current (DC), radio frequency (RF), etc. The generator ionizes the gas to form a plasma. The plasma is directed toward the target. In this case, reactive sputtering is utilized. The nitrogen in the plasma reacts with the surface of a titanium target to form a thin layer of TiN. In addition, the plasma hits the target causing the TiN to be stripped away from the target. The TiN coats the substrate and the wall of the sputtering chamber.

Sputtering has problems. If the sputtering occurs faster than the plasma reaction at the target (converting the surface titanium to TiN), some titanium will be sputtered from the target before it is converted to TiN. The titanium is incorporated into the sputtered film. Also, the bombardment of the plasma onto the target can generate chemical reactions. The plasma can strip the nitrogen and titanium atoms from one another within a TiN molecule. Anytime sputtering is used to deposit the TiN barrier layer, both TiN and titanium will be incorporated into the sputtered film. Within the sputtered TiN film, there will be titaniumrich areas. Compared to TiN, titanium is more reactive with the substrate and etchants. The titanium is more likely to form unwanted compounds (such as titanium silicide, $TiAl_3$, TiAlSi, etc.) or to be etched away more readily than the TiN.

The prior art uses one of two process flows at the metalization steps. The metal can be sputtered on top of the TiN during the same evacuation cycle, or the TiN can be exposed to air before the substrate is sputtered with metal. When the TiN and metal are sputtered during the same evacuation cycle, the substrate is constantly under vacuum. The metal sputtered onto the substrate will prevent air from coming in contact with the TiN. The integrity of the barrier layer is unacceptable using this method. The metal easily passes along the grain boundaries causing spike formation or metal diffusion into the substrate.

The other metalization process flow allows the vacuum on the chamber to be broken between the deposition of the TiN and the metal. Air at about room temperature and pressure is allowed to come in contact with the TiN before the metal is deposited. Oxygen from the air reacts with the titanium in the sputtered TiN film. Titanium dioxide ($TiO_2$) may be formed. Once reacted, titanium will not be able to form an undesired titanium compound. The oxygen is adsorbed onto the TiN grains at the grain boundaries within the TiN film. The TiN itself will not react with air at room temperature and pressure. The oxygen fills the grain boundaries thus eliminating migration paths. The oxygen adsorption is called "oxygen stuffing". The density of the sputtered film limits how much oxygen stuffing can occur. For most sputtering applications, the density of the sputtered film does not allow enough oxygen stuffing to prevent migration. Oxygen stuffing for an exposure to room-temperature air is very limited compared to a high temperature process or a plasm enhanced reaction. Most of the unreacted titanium and open grain boundaries remain within the film. Metal can pass through the sputtered TiN film.

Another prior art solution to the problem is to sputter the substrate with nitrogen-rich TiN. When reactive sputtering is used, the sputtering conditions can be changed. The change can cause a nitrogen-rich film to be deposited. Nitrogen is incorporated into the TiN film during the sputter. The nitrogen may react with the titanium during subsequent high temperature processing (such as an alloy cycle). Sputtering nitrogen-rich TiN is marginally effective. The nitrogen from the nitrogen-rich areas will not react with the titanium in the titanium-rich areas if the two areas do not come in contact with one another. The TiN separating the areas may prevent the reaction from occurring. The end result is that very little of the titanium is converted to TiN, yet most of the titanium remains unreacted within the TiN film.

Still another prior art process involves the use of rapid thermal annealers (RTAs). As previously mentioned, conversion of the titanium incorporated during the TiN sputter improves the barrier layer integrity. After the substrate has been sputtered with TiN, the substrate is processed in a RTA at about 800° C. to 900° C. in nitrogen for 30 to 60 seconds. The high temperature causes the reaction of titanium and nitrogen to form significantly more TiN than a room temperature exposure to air. The barrier layer becomes sealed preventing spike formation or metal diffusion into the substrate. Subsequent metals may be deposited without having to worry about the integrity of the barrier layer.

RTAs suffer from a key problem; they are not production worthy. Traditionally, RTAs have been plagued by numerous equipment failures. Also, RTAs have a greater potential for warping substrates than conventional semiconductor furnaces (such as a diffusion or alloy furnace). Warping can occur if the temperature gradient across the face of the substrate is too high or if the temperature of the substrate is changed too quickly. RTAs have the potential for causing both. Many RTAs use high power lamps to heat the substrate. If the relative position of the substrate to the lamps is not proper, one portion of the substrate can be at a different temperature than another. If the temperature gradient across the substrate is too large, the substrate will warp. High temperature ramp rates may cause warping, too. A RTA can ramp from room temperature to 900° C. in less than a half minute. A conventional diffusion tube takes 30 minutes or more to cover the same temperature range. Warping is much more likely to occur in a RTA than in a conventional furnace. Lithographic techniques used in semiconductor manufacturing assume that the substrate is flat. If the substrate is warped, lithographic patterns cannot be aligned over the entire surface of the substrate. Because of these limitations, RTAs are primarily used in limited production modes, such as research and development.

As will be seen, the present invention provides methods where the integrity of the barrier layer is improved by processing a sputtered TiN film in an atmospheric furnace or in a plasma reactor. The atmospheric process substantially seals the surface of the barrier layer prior to a subsequent metal deposition. The sealed surface prevents metal from getting into the grain boundaries thus preventing metal migration that results in spike formation or metal diffusion into the substrate. Anytime TiN is sputtered, titanium will be produced and incorporated into the film. Nitrogen-rich TiN by itself does not eliminate the need for subsequent processing to convert titanium to TiN. The atmospheric process uses a conventional atmospheric furnace, such as a diffusion or alloy furnace. The furnaces do not warp substrates as readily as RTAs. The furnaces are not prone to equipment failures like the RTAs.

The plasma process has a higher reaction rate of the plasma gas with titanium than exposure to room temperature air. The plasma reaction can use any gas that meets the following two constraints: First, the gas must react with titanium. Second, the gas must be able to become adsorbed onto the TiN grains at the grain boundaries within the TiN film. The gas reaction with titanium prevents the titanium from forming an undesired compound. Once the gas is adsorbed at the TiN grain boundaries, the grain boundaries "fill". Therefore, a subsequently deposited metal cannot migrate through the TiN barrier layer. Oxygen has been experimentally used and found to produce a substantially improved TiN layer. Oxygen reacts to form $TiO_2$, and oxygen is adsorbed by the TiN grains at the grain boundaries within the TiN film. Other gases, such as nitrogen, are expected to work if they meet the previously stated constraints. Nitrogen-rich TiN does not eliminate the need for subsequent processing to convert titanium to TiN. The plasma method can use a conventional sputtering system. The system does not warp substrates as readily as RTAs. The systems are not prone to equipment failures like the RTAs. In addition, the plasma method can be utilized so that the three steps (TiN deposition, reaction, and subsequent metal deposition) take place during the same evacuation cycle on the same sputter. The integrated plasma reaction method increases manufacturing efficiencies by reducing time between steps, by not requiring additional equipment, and by reducing operator handling. Less handling of the substrate results in higher yields.

SUMMARY OF THE INVENTION

The present invention provides methods to improve the integrity of a TiN barrier layer. An atmospheric process substantially seals the surface of the barrier layer prior to subsequent metal depositions. The sealed surface prevents metal from getting into the grain boundaries of the TiN barrier layer thus preventing metal migration that results in spike formation or metal diffusion into the substrate.

A plasma process causes the plasma gas to react with the unreacted titanium in the TiN barrier layer to form desired titanium compounds (such as TiN, $TiO_2$, etc.). Once reacted, the titanium will not be able to form undesired titanium compounds. In addition, the gas used for the plasma reaction is adsorbed onto the TiN grains at the grain boundaries within the TiN film. The adsorbed gas fills the grain boundaries. Therefore, the subsequently deposited metal will not to migrate through the TiN barrier layer. In addition, the plasma reaction can take place during the same evacuation cycle on the same sputter as the TiN and metal depositions. The integrated process increases manufacturing efficiencies by reducing time between steps, by not requiring additional equipment, and by reducing operator handling.

Both methods are more effective than sputtering the film with a nitrogen-rich TiN film by itself. The sputtered film will still have some areas which are titanium rich. The invention does not use RTAs. Problems caused by warpage or equipment failures are significantly reduced.

DETAILED DESCRIPTION OF THE PRESENT INVENTION

Figure 1:
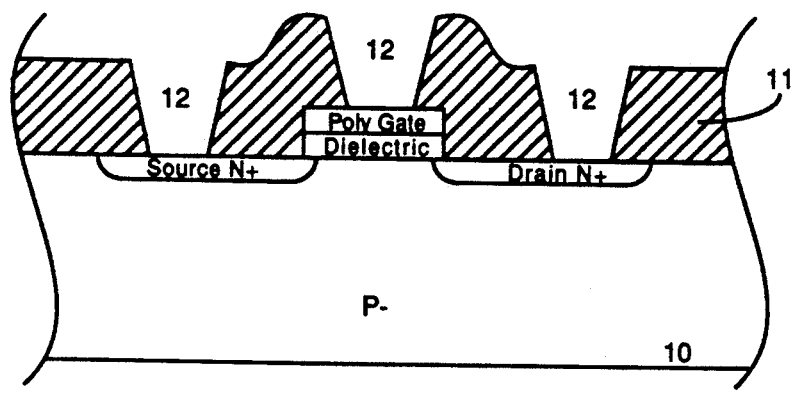
FIG. 1 is a cross sectional view of a semiconductor substrate following the formation of contact openings.

The invention of two different methods that significantly improve the integrity of a TiN barrier layer is disclosed. The methods substantially reduce the problem of metal migration through the TiN barrier layer. Metal migration may result in spike formation and diffusion of the metal into the substrate. The two methods listed below are the current preferred embodiments of those methods. In the following description, numerous details are set forth, such as specific materials, process parameters, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

The invention disclosed will describe the procedure used in conjunction with making a MOS device. This procedure is equally suited for any device where a TiN barrier layer will be used between a layer or layers of metal and an underlying semiconductor.

The substrate will be subjected to many different process steps which define the electrical components which make up the integrated circuits. The process involves field isolation, gate definition, source/drain implants, interlevel dielectrics, contact definition, metalization, and passivation. The steps up to metalization will be briefly covered. The actual steps used are not critical to the invention.

1. Field isolation. The substrate is oxidized in an atmospheric furnace to grow about 500 Å of silicon dioxide. Silicon nitride is deposited on the substrate. The nitride is about 1000 Å thick. The substrate is then patterned with a field isolation mask using conventional photolithographic means. The masked substrate is etched in a conventional plasma etcher to remove the nitride. Most of the oxide remains on the substrate. After the resist is removed, the substrate is subjected to a steam oxidation. The resulting field oxidation is about 7000 Å thick.

2. Gate definition. The substrate is subjected to a short HF deglaze followed by a phosphoric acid etch. The two steps will remove the nitride from the active device areas of the substrate. Another HF dip will follow the phosphoric acid etch. The HF dip will only be long enough to remove the residual pre-nitride oxide. Most of the field oxide will remain on the substrate. A high-quality dry oxidation is grown from the substrate to form the gate dielectric. The gate dielectric is about 250 Å thick. Silicon nitride can be used as the gate dielectric. The substrate is deposited with about 3000 Å of polycrystalline silicon (poly). As an alternative, amorphous silicon can be used. The poly is heavily doped. The doping can occur as an in-situ process with the poly deposition. As an alternative, a separate ion implantation step or a separate furnace doping step could follow the poly deposition. The only requirement is that the poly gate be conductive. The substrate is patterned with a gate mask using conventional photolithographic techniques. The masked substrate is etched in a conventional plasma etcher to remove the poly but still leave most of the oxide. The resist is removed.

3. Source/drain implants. The substrate is patterned with a source/drain mask using conventional photolithographic techniques. The masked substrate is heavily implanted so that a low resistance contact can be made to the source and drain regions of the devices. After the implant, the resist is removed.

4. Interlevel dielectric. The types of dielectrics that could be used is plentiful. The dielectric used in the invention is a one $\mu$m silicon dioxide film with 4 wt. % boron and 4 wt. % phosphorus incorporated into the film. This film will be referred to as BPSG.

5. Contact definition. The substrate is patterned with a contact mask using conventional photolithographic techniques. The masked substrate is etched in a conventional plasma etcher to remove the oxide while not etching too much of the source, drain, or poly.

FIG. 1 shows a cross sectional view of a substrate up to this point in the process flow. For simplicity, the field isolations regions are not shown. Region 10 is the substrate. The substrate is lightly doped P-type crystalline silicon with a resistivity of about 50 ohm-cm. The actual resistance is not critical to the invention. Region 11 is the BPSG. Region 12 are the contact openings so that the barrier layer can make direct contact to the source, drain, and poly gate. The source, drain, and poly gate are heavily N-type doped (about 5E19 ions/cm$^3$ or higher). The actual concentration is not critical since the source, drain, and poly gate are doped to be highly conductive.

Figure 2:
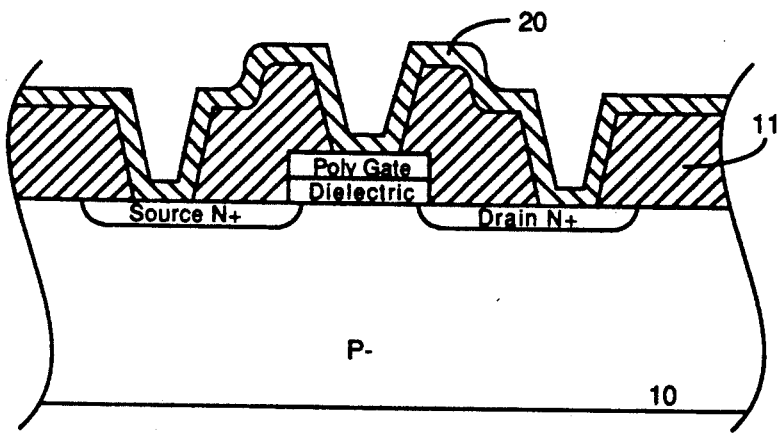
FIG. 2 is a cross sectional view of the substrate of FIG. 1 after a layer of TiN has been deposited.

The substrate is deposited with nitrogen-rich TiN. The film is deposited using reactive sputtering techniques. The sputtering parameters are: system pressure is between 4 and 12 millitorr; sputtering ambient of 60% N2/40% Ar to 100% N2; and DC power between 3 to 8 kilowatts. The sputtering machine used is the Anelva 1015 system. The sputtering parameters are not critical to the invention. FIG. 2 is a cross sectional view after TiN deposition. Region 20 is the TiN barrier layer. The integrity of the TiN barrier layer can be improved using one of two methods disclosed below.

The integrity of the TiN barrier layer can be improved by an anneal in an atmospheric furnace. An example of the system would be a conventional semiconductor diffusion or alloy furnace. The use of a diffusion or alloy furnace is not critical. The important criteria is that the system be operated at approximately atmospheric pressure and that the annealing conditions be sufficient to seal the surface of the TiN barrier layer. Below is a list of parameters that may be changed, the range of values for those parameters, and reasons for the selected ranges:

a. Temperature. The preferred temperature is about 400° C. Below 300° C., temperature control of the furnace becomes difficult. Above 650° C., conversion of TiN to other compounds may become an issue if impurities are present within the furnace.

b. Time. The total anneal time must be greater than 80 minutes. Experiments have shown that 80 minutes is insufficient to anneal the surface. Times of about 110 minutes to about 120 minutes are optimal. Longer times may be used. With longer times, machine throughput decreases. Longer time pose an additional risk. If there are any impurities within the furnace, the longer times may allow conversion of the TiN barrier layer into unwanted by products if impurities are present within the furnace.

c. Ambient. Hydrogen and nitrogen have been used. The preferred sequence of gases uses about 40 minutes of nitrogen, followed by about 40 minutes of hydrogen, and finishing with about 40 minutes of nitrogen. This will be referred to as the hydrogen anneal. Auger analysis following the hydrogen-annealed TiN film shows that hydrogen is incorporated into the TiN film. An all nitrogen anneal has been tested under the same processing conditions. Both processes substantially seal the barrier layer surface. The hydrogen anneal has been found to perform better than nitrogen. Hydrogen yields a better barrier quality, better threshold voltage control, and substantially reduced nitrogen contamination in subsequently deposited metals. Still, nitrogen may be used. For the hydrogen anneal, relatively longer hydrogen times and shorter nitrogen times (within the overall time constraints listed above) do not deviate from the scope or spirit of the invention. Forming gas is defined as a mixture of nitrogen gas and hydrogen gas where hydrogen makes up no more than 30% of the gas mixture. Forming gas is expected to substantially seal the barrier layer surface.

A plasma reaction can be used to improve the integrity of the TiN barrier layer. The plasma gas reacts with the titanium within the TiN barrier layer to form desired titanium compounds. The reacted titanium will not be able to form undesired titanium compounds. The gas is adsorbed onto the TiN grains at the grain boundaries within the TiN film. The adsorbed gas fills the grain boundaries. Therefore, the subsequently deposited metal will not to migrate through the TiN barrier layer. An example of the plasma reactor would be an Anelva 1015 sputtering system. The use of this specific plasma reactor is not critical. The important criteria is that the system be capable of being operated with process parameters listed hereinafter. The optimal conditions for the plasma reaction are: temperature at approximately 300° C., using oxygen at a pressure of about 20 millitorr (mT), and RF power of approximately 20 watts for reaction time of about 60 seconds. The plasma formed can be either a conventional or downstream plasma. These processing conditions have been found to be optimal.

The processing parameters can be varied and still achieve a substantially improved barrier layer without significant conversion of TiN to other titanium compounds. Below is a list of the parameters that may be changed, the range of values for those parameters, and reasons for the selected ranges.

a. Temperature. The processing temperature can range from room temperature to about 300° C. When the temperature is too low, there will not be a significant amount of titanium reaction with the plasma gas. Too high of a temperature risks reaction of the TiN film with the plasma gas or impurities present in the system. If oxygen is the plasma gas, the TiN can be converted to $TiO_2$. $TiO_2$ is an insulator. Insulators prevent electrical contact between the substrate and subsequent metal depositions.

b. Pressure. The reactor pressure can be varied from about 5 to about 20 mT. A plasma may not be struck below the lower pressure limit. The result is that there will not be any significant conversion of the unreacted titanium to $TiO_2$. The upper limit on the pressure is for mechanical concerns. High pressures burden the cryogenic pumps (cryos) too much. The cryos maintain the vacuum on the processing chamber. The cryos will need to be regenerated more frequently if the pressure is too high.

c. Power. The RF power can be set between about 8 to about 100 watts. A plasma may not be struck below the lower power limit. The result is that there will not be any significant conversion of the unreacted titanium to $TiO_2$. Above the upper limit, particle problems start. The material sputtered on the chamber walls will flake off and can land on the substrate. Particles are a major yield loss mechanism. In addition, the upper power limit is needed for safety reasons. The system can generate ozone.

d. Time. Reaction times can be up to approximately 60 seconds. Beyond 60 seconds, the throughput of the equipment becomes limiting. TiN conversion to undesired compounds is not a concern with longer reaction times.

e. Ambient. The plasma reaction can use any gas that meets the following two constraints: First, the plasma gas must be able to react with titanium to form desired titanium compounds. Second, the gas must be able to become adsorbed onto the TiN grains at the grain boundaries within the TiN film. The titanium reaction with the plasma gas will prevent titanium from forming undesired titanium compounds. Once the gas is adsorbed, the grain boundaries "fill". Therefore, a subsequently deposited metal cannot migrate though the TiN barrier layer. Oxygen has been experimentally used and found to produce a substantially improved TiN layer. Oxygen reacts with titanium to form $TiO_2$, and oxygen is adsorbed to the TiN grains at the grain boundaries of the TiN film. Film analysis shows that oxygen is incorporated into the film. Other gases, such as nitrogen, are expected to work as long as the previously stated gas constraints are met.

The previous discussion of the plasma method only concerns the plasma step itself. The integration of the process flow has not been addressed. In the preferred embodiment, the deposition of TiN, the plasma reaction, and the subsequent metal deposition all occur in the same machine during the same evacuation cycle. The Anelva 1015 system is capable of doing this. The process flow requires less equipment and less operator handling. Reduced capital costs and higher yields result from using this integrated process.

The preferred embodiment is not meant to exclude other processing options. For example, the vacuum can be broken between each of the process steps. The substrate may be treated in different equipment for the three steps. A sputtering system does not have to be used for the plasma reaction. Any piece of equipment capable of processing to the aforementioned conditions will perform the desired reactions giving a substantially improved TiN barrier layer. The different process integration options can be done without significantly deviating from the scope or spirit of the invention.

Figure 3:
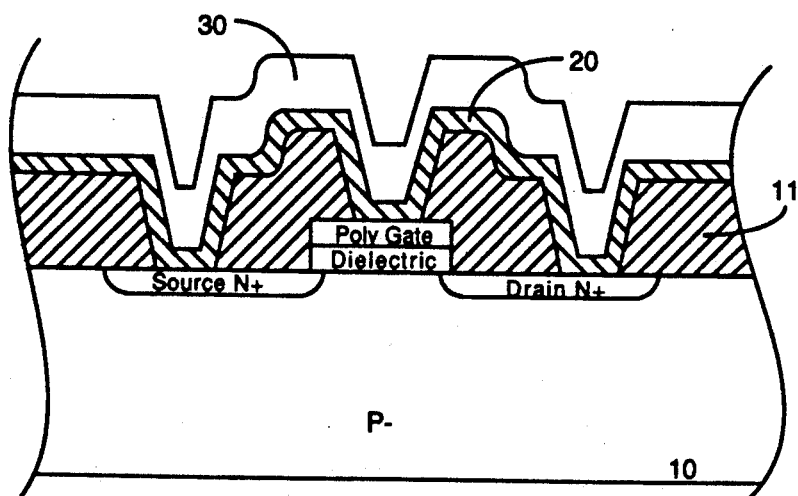
FIG. 3 is a cross sectional view of the substrate of FIG. 2 following deposition of a metalization interconnect layer.

One or more metal layers are deposited on the substrate following the atmospheric furnace anneal or the plasma reaction. FIG. 3 shows the metal in region 30 deposited over the surface of the substrate. The metal is aluminum containing a small amount of copper. The amount of copper in the aluminum is not critical to the invention. Other metals or other aluminum compounds containing silicon, titanium, etc. can be used without significantly deviating from the invention. Subsequent masking and etch operations will determine the final metal pattern. The steps following the metal deposition in FIG. 3 are not critical to the invention.

Thus, methods for substantially improving the integrity of a TiN barrier layer by reducing contact spike formation and metal diffusion into a substrate has been described.

I claim:

1. A method of forming metalized interconnects on a semiconductor substrate comprising the steps of:
   (a) depositing a titanium nitride barrier layer onto said substrate;
   (b) after depositing said titanium nitride barrier layer exposing said titanium nitride barrier layer to a plasma gas to react said plasma gas with titanium within said titanium nitride barrier layer and to fill grain boundaries within said titanium nitride barrier layer; and
   (c) depositing at least one metal layer over said plasma reacted titanium nitride barrier layer.

2. The method of claim 1, wherein all steps take place during at least one evacuation cycle.

3. The method of claim 1, wherein all steps take place in at least one piece of equipment.

4. The method of claim 1, wherein said barrier layer is exposed to said plasma gas for a time no greater than 60 seconds.

5. The method of claim 1, wherein said barrier layer is exposed to said plasma gas at a temperature in a range of approximately 20° C. through 300° C.

6. The method of claim 1, wherein said barrier layer is exposed to said plasma gas at a pressure in a range of approximately 5 mT through 20 mT.

7. The method of claim 1, wherein said barrier layer is exposed to said plasma gas at a RF power in a range of approximately 8 watts through 100 watts.

8. The method of claim 1, wherein said plasma gas comprises a gas selected from the group consisting of oxygen and nitrogen.

9. A method of forming metalized interconnects on a semiconductor substrate comprising the steps of:
   (a) depositing a titanium nitride barrier layer onto said substrate:
   (b) exposing said titanium nitride barrier layer to a plasma gas to react said plasma gas with titanium within said titanium nitride barrier layer and to fill grain boundaries within said titanium nitride barrier layer wherein said titanium nitride barrier layer is exposed to said plasma gas for a time of approximately 60 seconds, at a temperature of approximately 300° C., at a pressure of approximately 20 mT, and at a RF power of approximately 20 watts: and
   (c) depositing at least one metal layer over said plasma reacted titanium nitride barrier layer.

* * * * *